(12) United States Patent
Shibata

(10) Patent No.: US 6,943,082 B2
(45) Date of Patent: Sep. 13, 2005

(54) METHOD FOR MANUFACTURING A NONVOLATILE MEMORY DEVICE

(75) Inventor: Takumi Shibata, Ichinomiya (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 10/379,114

(22) Filed: Mar. 3, 2003

(65) Prior Publication Data

US 2004/0018685 A1 Jan. 29, 2004

(30) Foreign Application Priority Data

Mar. 5, 2002 (JP) .................................. 2002-059145

(51) Int. Cl.⁷ ........................ H01L 21/336; H01L 29/788
(52) U.S. Cl. .................. 438/259; 438/267; 438/303; 438/304; 438/305; 257/315; 257/330
(58) Field of Search ................................ 438/259, 267, 438/303–306; 257/330, 327, 315, E21.679, E27.103

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,666,311 A * | 9/1997 | Mori | 438/257 |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | 438/257 |
| 6,388,293 B1 | 5/2002 | Ogura et al. | 257/365 |
| 6,399,441 B1 | 6/2002 | Ogura et al. | 438/257 |
| 6,413,821 B1 | 7/2002 | Ebina et al. | |
| 6,469,935 B2 | 10/2002 | Hayashi | 365/185.18 |
| 6,518,124 B1 | 2/2003 | Ebina et al. | |
| 6,531,350 B2 * | 3/2003 | Satoh et al. | 438/197 |
| 6,596,590 B1 * | 7/2003 | Miura et al. | 438/261 |
| 2002/0100929 A1 | 8/2002 | Ebina et al. | |
| 2002/0127805 A1 | 9/2002 | Ebina et al. | |
| 2002/0149060 A1 | 10/2002 | Ogura et al. | 257/365 |
| 2002/0149061 A1 | 10/2002 | Ogura et al. | 257/368 |
| 2003/0054610 A1 | 3/2003 | Ebina et al. | |
| 2003/0057505 A1 | 3/2003 | Ebina et al. | |
| 2003/0058705 A1 | 3/2003 | Ebina et al. | |
| 2003/0060011 A1 | 3/2003 | Ebina et al. | |

FOREIGN PATENT DOCUMENTS

| | | | |
|---|---|---|---|
| JP | 7-161851 | 6/1995 | |
| JP | 8-172174 | 7/1996 | ......... H01L/27/115 |
| JP | 2978477 | 9/1999 | |
| JP | 2000-150678 | 5/2000 | ....... H01L/21/8247 |
| JP | 2001-148434 | 5/2001 | ....... H01L/21/8247 |
| JP | 2001-156188 | 6/2001 | |

OTHER PUBLICATIONS

Japanese Examination Result for 2002–059145.
Chen, et al., "A Novel Flash Memory Device with S Plit Gate Source Side Injection and ONO Charge Storage Stack (SPIN)," 1997 Symposium on VLSI Technology Digest of Technical Papers, pp. 63–64.
Chang, et al., "A New SONOS Memory Using Source–Side Injection for Programming," IEEE Electron Device Letters, vol. 19, No. 7, Jul. 1998, pp. 253–255.
Hayashi, et al., "Twin MONOS Cell with Dual Control Gates," 2000 Symposium on VLSI Technology Digest of Technical Papers (2 pages).

* cited by examiner

*Primary Examiner*—Hsien Ming Lee
(74) *Attorney, Agent, or Firm*—Harness, Dickey & Pierce, P.L.C.

(57) ABSTRACT

A method, for manufacturing a nonvolatile memory device, includes: forming a gate layer above which a stopper layer is disposed on a semiconductor layer; forming control gates on both side surfaces of the gate layer with an ONO film interposed therebetween; forming an insulating layer over the entire surface; polishing the insulating layer so that the stopper layer is exposed; removing the stopper layer and thereby exposing the top surface of the gate layer; forming a conductive layer above the gate layer and the insulating layer; etching the conductive layer and the gate layer and thereby forming a word line and a word gate and removing the gate layer remained under the etching.

13 Claims, 12 Drawing Sheets

METHOD FOR MANUFACTURING A NONVOLATILE MEMORY DEVICE

TECHNICAL FIELD

The present invention relates to a method for manufacturing a nonvolatile memory device, in particular, to a method for manufacturing a nonvolatile memory device having a plurality of charge storage regions for one word gate.

BACKGROUND

As one type of nonvolatile memory devices, there is a type called a MONOS (Metal Oxide Nitride Oxide Semiconductor) type or SONOS (Silicon Oxide Nitride Oxide Silicon) type in which a gate insulating layer between a channel region and a control gate is made of a laminated body of a silicon oxide layer/a silicon nitride layer/a silicon oxide layer and the silicon nitride layer traps electric charges.

As the MONOS type nonvolatile memory device, a device shown in FIG. 21 is known (Y. Hayashi, et al, 2000 Symposium on VLSI Technology Digest of Technical Papers, p.122–p. 123).

In a memory cell 100 of the MONOS type, a word gate 14 is formed on a semiconductor substrate 10 with a first gate insulating layer 12 interposed therebetween. On both sides of the word gate 14, a side wall-like first control gate 20 and second control gate 30 are disposed, respectively. Between a bottom portion of the first control gate 20 and the semiconductor substrate 10, there is disposed a second gate insulating layer 22, and between a side surface of the first control gate 20 and the word gate 14, there is an insulating layer 24. Similarly, between a bottom portion of the second control gate 30 and the semiconductor substrate 10, there is a second gate insulating layer 22, and between a side surface of the second control gate 30 and the word gate 14, there is an insulating layer 24. In addition, between the control gate 20 and the control gate 30, of adjacent memory cells (no interposed word gate 14), in the semiconductor substrate 10, an impurity layer 16 or 18 that constitutes a source region or a drain region is formed.

Thus, one memory cell 100 has two MONOS type memory elements on the side surfaces of the word gate 14. Furthermore, these two MONOS type memory elements can be independently controlled. Accordingly, one memory cell 100 can memorize 2-bit information.

SUMMARY

Embodiments of the present invention provide: methods for manufacturing a MONOS-type nonvolatile memory device having a plurality of charge storage regions; and the resulting memory devices.

A method for manufacturing a nonvolatile memory device according to an embodiment of the present invention includes: forming a gate layer above which a stopper layer is disposed on a semiconductor layer; forming a side wall-like control gate on each of both side surfaces of the gate layer through an ONO film interposed therebetween; forming an insulating layer on the entire surface; polishing the insulating layer so as to expose the stopper layer; removing the stopper layer, and thereby exposing the top surface of the gate layer; forming a conductive layer above the gate layer and the insulating layer; forming a word line and a word gate by etching the conductive layer and the gate layer, wherein the gate layer is not completely removed; and removing the gate layer remained under the etching.

Additional features and advantages of the invention will be more fully apparent from the following detailed description of example embodiments, the appended claims and the accompanying drawings.

The accompanying drawings are: intended to depict example embodiments of the invention and should not be interpreted to limit the scope thereof; and not to be considered as drawn to scale unless explicitly noted.

DETAILED DESCRIPTION

Nonvolatile Memory Device Structure

Figure 1:
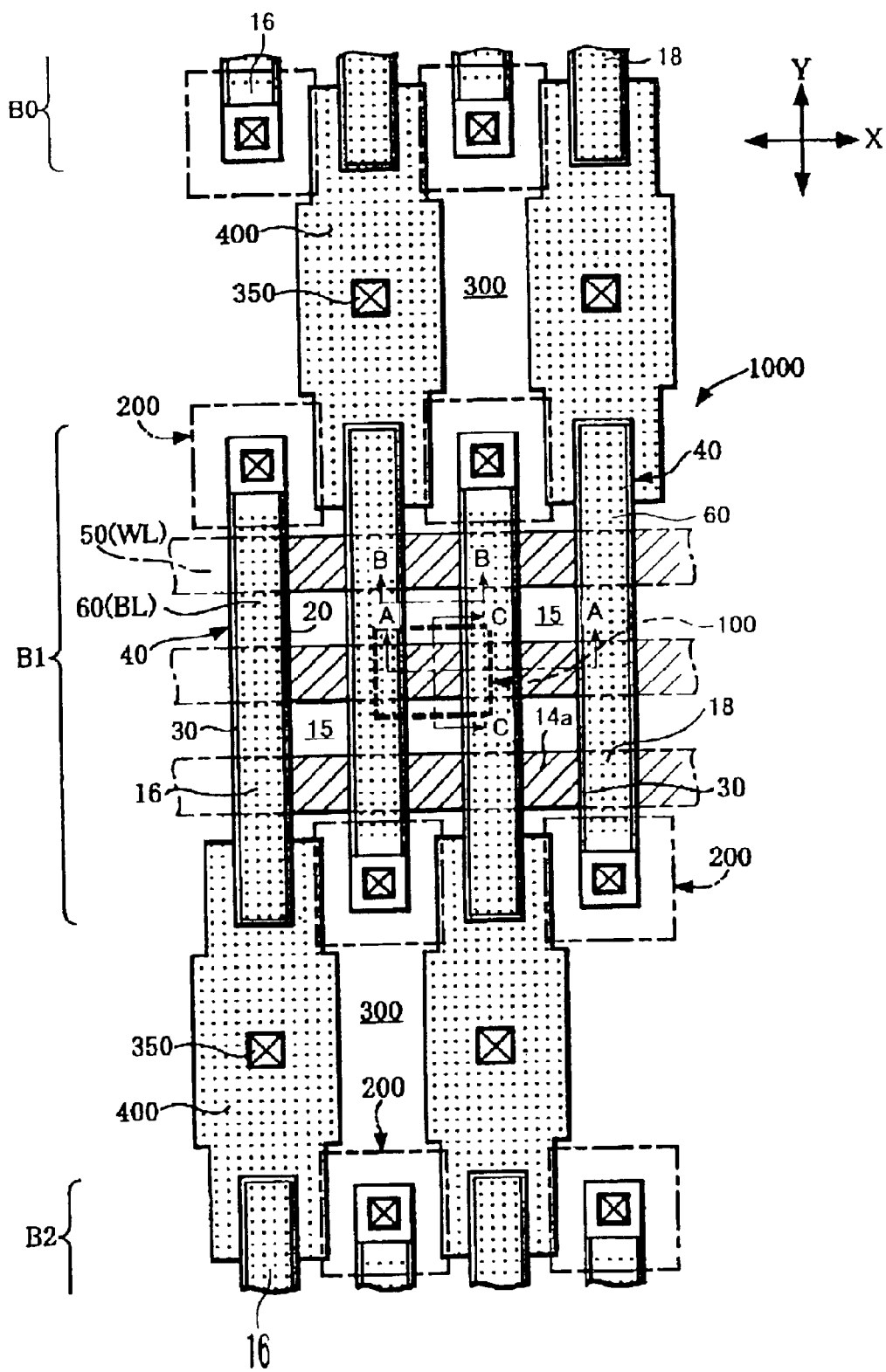
FIG. 1 is a plan view schematically showing a layout of a semiconductor device according to an embodiment of the present invention.

FIG. 1 is a plan view showing a layout of a semiconductor device including a nonvolatile memory device according to an embodiment of the invention manufactured by a method according to another embodiment of the present invention. The semiconductor device includes a memory region 1000.

In the memory region 1000, MONOS-type nonvolatile memory devices (hereinafter referred to as "memory cells") 100 are arranged in a plurality of columns and rows in a lattice. In the memory region 1000, a first block B1 and part of other blocks B0 and B2 adjacent to the first block B1 are shown. Each of the blocks B0 and B2 has a configuration that is obtained by reversing the block B1.

Partially in a region between the block B1 and each of the adjacent blocks B0 and B2, an element isolation region 300 is formed. In each of the blocks, a plurality of word lines 50 (WL) extending in an X direction (row direction), and a plurality of bit lines 60 (BL) extending in a Y direction (column direction) are disposed. One word line 50 is connected to a plurality of word gates 14a arranged in an X direction. The bit lines 60 are includes impurity layers 16 and 18.

A conductive layer 40 that includes the first and second control gates 20 and 30 is disposed so as to surround each of the impurity layers 16 and 18. That is, the first and second control gates 20 and 30 extend in a Y direction, and each pair of the first and second control gates 20 and 30 are connected to each other at the end through a conductive layer extending in an X direction. Furthermore, each pair of the first and second control gates 20 and 30 are connected at another end to a common contact portion 200. Accordingly, the conductive layer 40 has a function of a control gate of a memory cell and a function as a wiring connecting the respective control gates arranged in a Y direction.

A single memory cell 100 includes one word gate 14a, first and second control gates 20 and 30, and impurity layers 16 and 18. The first and second control gates 20 and 30 are formed on both sides of the word gate 14a. The impurity layers 16 and 18 are formed outside of the control gates 20 and 30. Each of the impurity layers 16 and 18 is shared between adjacent memory cells 100.

The impurity layer 16 formed in the block B1 and the impurity layer 16 formed in the block B2 are adjacent to each other in a Y direction are electrically connected to each other through a contact impurity layer 400 formed within the semiconductor substrate. The contact impurity layer 400 is formed on a side opposite to the common contact portion 200 of the control gate with respect to the impurity layer 16.

On the contact impurity layer 400, a contact 350 is formed. The bit line 60 (again, including the impurity layer 16) is electrically connected to a wiring layer of an upper layer through the contact 350.

Similarly, the impurity layer 18 formed in the block B1 and the impurity layer 18 formed in the block B0 are adjacent to each other in a Y direction, on a side where the common contact portion 200 is not disposed, and are electrically connected to each other through another contact impurity layer 400. As is apparent from FIG. 1, in one block, in a plan layout of a plurality of the common contact portions 200, the impurity layer 16 and the impurity layer 18 are formed alternately on different sides, resulting in a staggered lattice. Further, with respect to one block, in a plan layout of a plurality of the contact impurity layers 400, the impurity layer 16 and the impurity layer 18 are formed alternatively on different sides, resulting in a staggered lattice.

Figure 2:
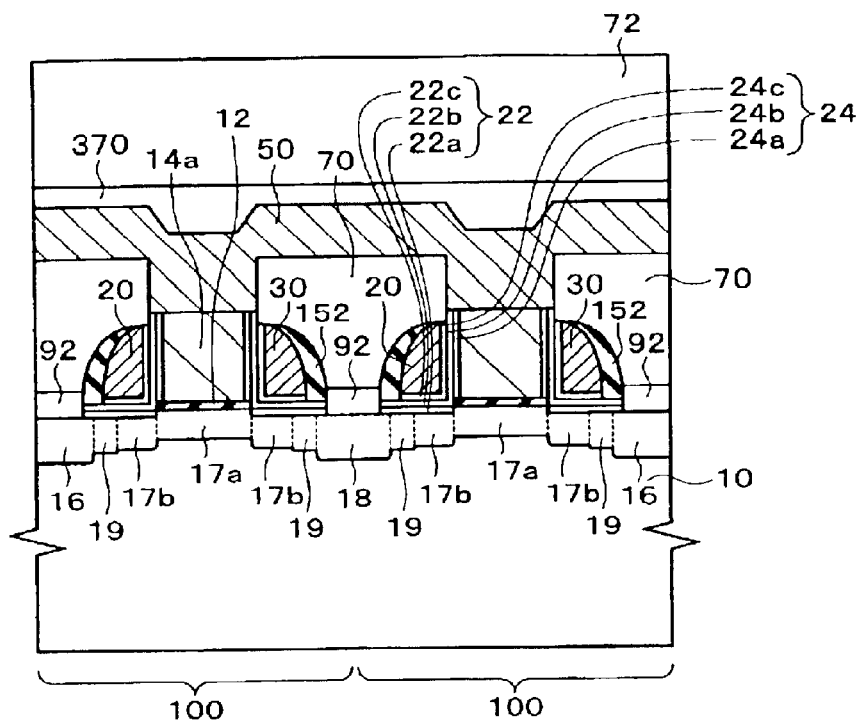
FIG. 2 is a cross sectional view schematically showing a portion along an A—A line of FIG. 1.
Figure 3:
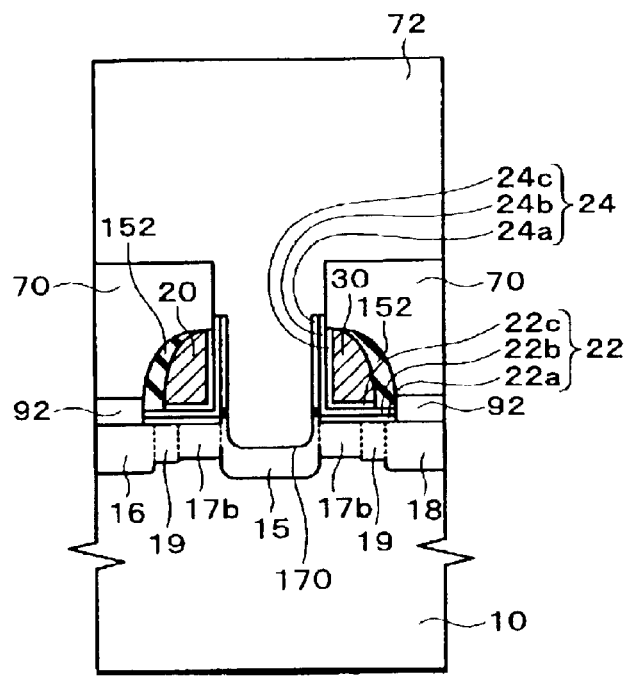
FIG. 3 is a cross sectional view schematically showing a portion along a B—B line of FIG. 1.
Figure 4:
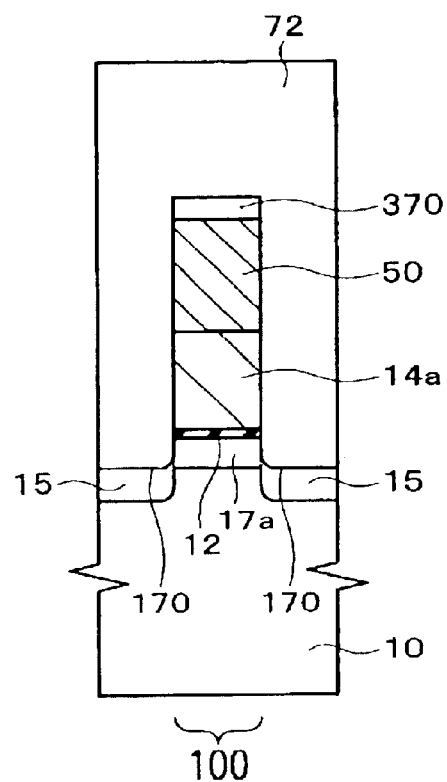
FIG. 4 is a cross sectional view schematically showing a portion along a C—C line of FIG. 1.

Next, with reference to FIGS. 2 through 4, cross sectional structures of the semiconductor device of FIG. 1 will be explained. FIG. 2 is a cross sectional view along an A—A line of FIG. 1. FIG. 3 is a cross sectional view along a B—B line of FIG. 1. FIG. 4 is a cross sectional view along a C—C line of FIG. 1.

In the memory region 1000, the memory cell 100 includes the word gate 14a, impurity layers 16 and 18, the first control gate 20 and the second control gate 30. The word gate 14a is formed above a semiconductor substrate 10 on the first gate insulating layer 12 interposed therebetween. The impurity layers 16 and 18 are formed inside of the semiconductor substrate 10. Each of the impurity layers 16 and 18 becomes a source region or a drain region. Furthermore, on each of the impurity layers 16 and 18, a suicide layer 92 is formed.

The first and second control gates 20 and 30 are formed along both sides of the word gate 14a, respectively. The first control gate 20 is formed above the semiconductor substrate 10 with a second gate insulating layer 22 interposed therebetween and opposite to one side surface of the word gate 14a through a side insulating layer 24 interposed therebetween. Similarly, the second control gate 30 is formed above the semiconductor substrate 10 with the second gate insulating layer 22 interposed therebetween and opposite to the other side surface of the word gate 14a through a side insulating layer 24 interposed therebetween. A cross sectional shape of each of the control gates becomes similar to a cross sectional structure of a sidewall insulating layer in an existing MOS transistor.

The second gate insulating layer 22 can be an ONO film. Specifically, the second gate insulating layer 22 is a laminate film of, e.g., a bottom silicon oxide layer (first silicon oxide layer) 22a, a silicon nitride layer 22b, and a top silicon oxide layer (second silicon oxide layer) 22c.

The first silicon oxide layer 22a forms a potential barrier between a channel region and a charge storage region.

The silicon nitride layer 22b functions as a charge storage region that traps a carrier (for instance, electrons).

The second silicon oxide layer 22c forms a potential barrier between the control gate and the charge storage region.

The side insulating layer 24 can be an ONO film. Specifically, the side insulating layer 24 is a laminate film of, e.g., a first silicon oxide layer 24a, a silicon nitride layer 24b and a second silicon oxide layer 24c. The side insulating layer 24 electrically separates the word gate 14a from each of the control gates 20 and 30. Furthermore, in the side insulating layer 24, the top end of at least the first silicon oxide layer 24a, is disposed at an upper position than those (that is extends upward beyond) of top ends of the control gates 20 and 30 with respect to the semiconductor substrate 10 in order, e.g., to inhibit the short circuit from occurring between the word gate 14a and each of the first and second control gates 20 and 30.

The side insulating layer 24 and the second gate insulating layer 22 can be formed in the same deposition process. Accordingly, the layer structures thereof can be the same.

In adjacent memory cells 100, between the adjacent first control gate 20 and second control gate 30, a second insulating layer 70 is formed. The second insulating layer 70 covers the control gates 20 and 30 so as not to expose at least these. Furthermore, the top surface of the second insulating layer 70 is disposed at a higher position than (that is, extends upward beyond) the top surface of the word gate 14a through respect to the semiconductor substrate 10. By thus forming the second insulating layer 70, the first and second control gates 20 and 30 can be electrically separated in more effectively from the word gate 14a and the word line 50. Above the word line 50, a silicon oxide layer 370 is formed.

On the semiconductor substrate 10 thereon the memory cells 100 and so on are formed, an interlayer insulating layer 72 is formed.

Furthermore, as shown in FIGS. 2 through 4, in a region between the word gates 14a in a Y direction, a groove 170 is disposed in the semiconductor substrate 10. In the groove 170, the interlayer insulating layer 72 is buried. This structure takes a structure similar to that of trench element isolation. Thereby, element isolation characteristics between adjacent memory cells 100 can be improved.

Furthermore, in the semiconductor substrate 10, in a region more inward from the groove 170, a, e.g., an impurity P type, layer (impurity layer for use in element isolation) 15 is formed (FIGS. 2 through 4). Through the P type impurity layer 15, the element isolation between adjacent memory cells 100 can be better achieved.

Nonvolatile Memory Device Manufacture

Figure 13:
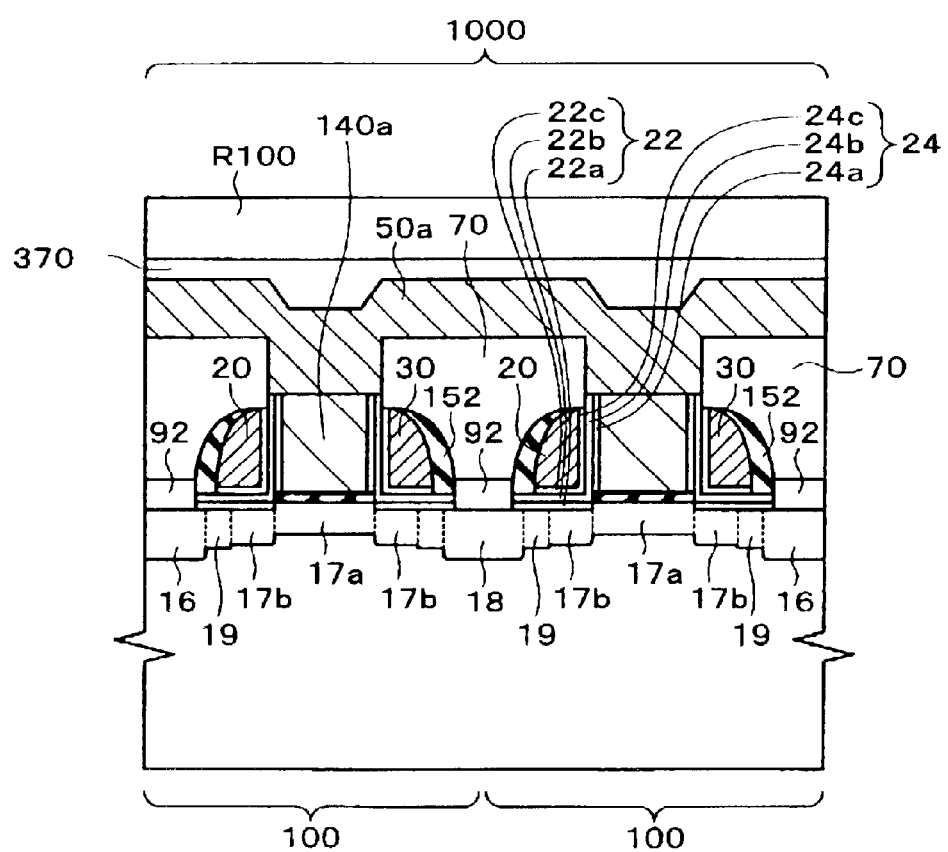
FIG. 13 is a diagram showing a process in one embodiment according to the present invention.
Figure 14:
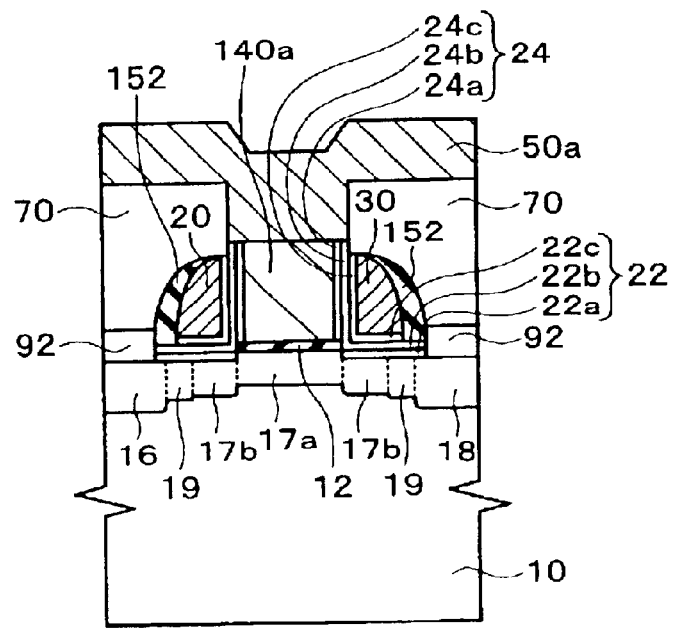
FIG. 14 is a diagram showing a process in one embodiment according to the present invention.
Figure 15:
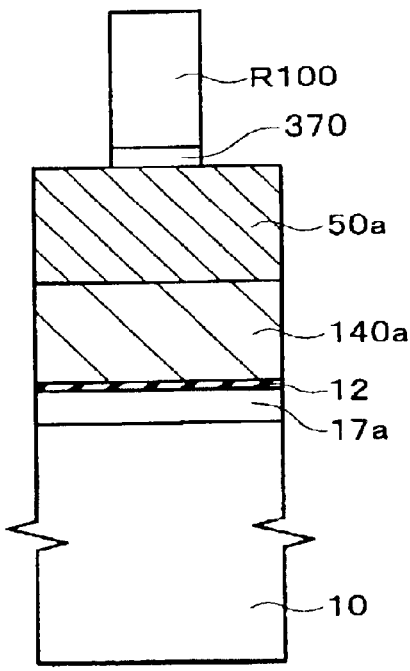
FIG. 15 is a diagram showing a process in one embodiment according to the present invention.
Figure 16:
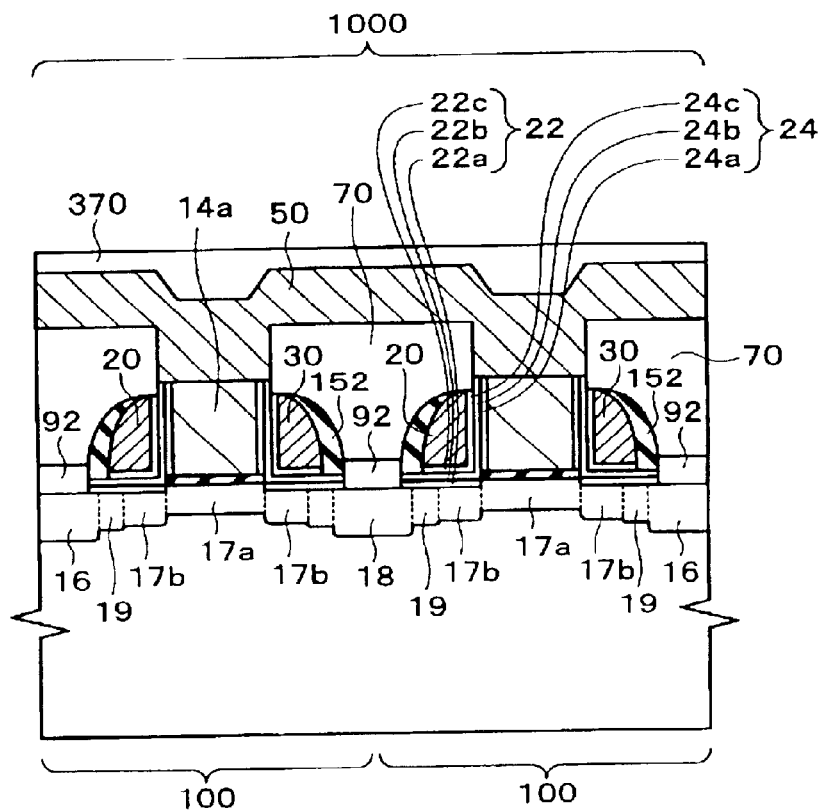
FIG. 16 is a diagram showing a process in one embodiment according to the present invention.
Figure 17:
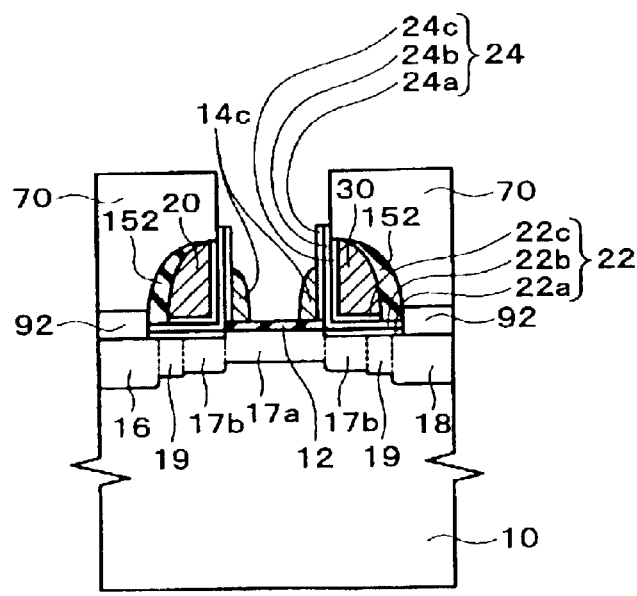
FIG. 17 is a diagram showing a process in one embodiment according to the present invention.
Figure 18:
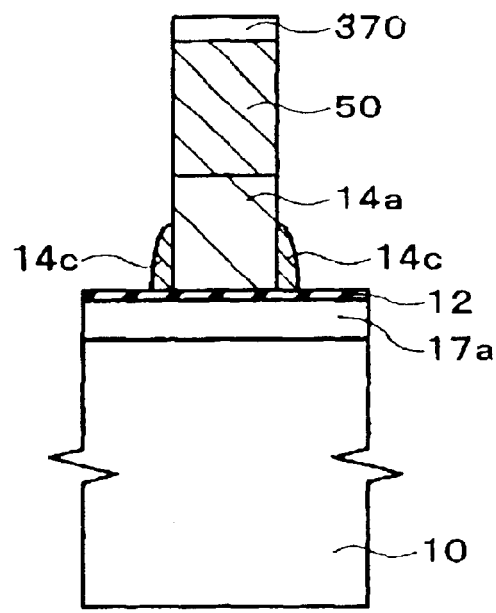
FIG. 18 is a diagram showing a process in one embodiment according to the present invention.
Figure 19:
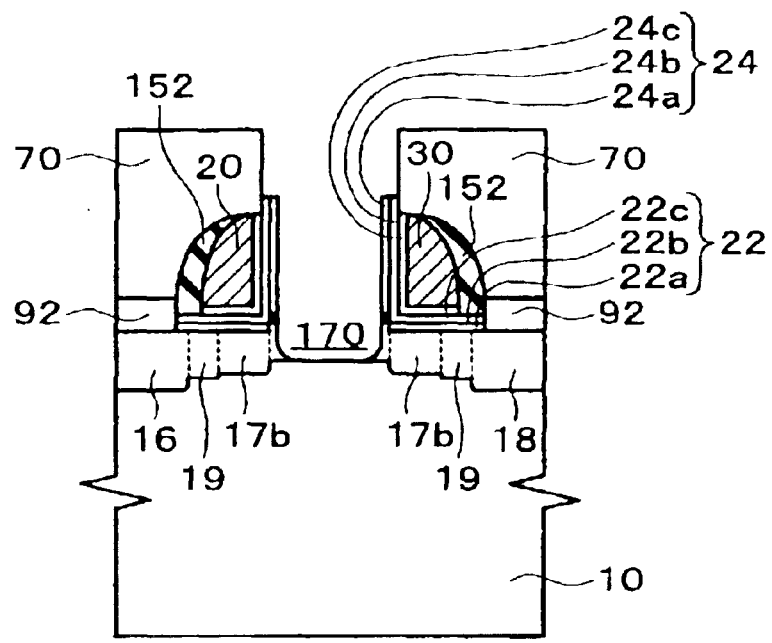
FIG. 19 is a diagram showing a process in one embodiment according to the present invention.
Figure 20:
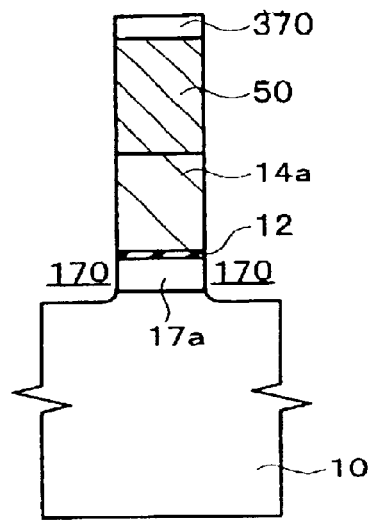
FIG. 20 is a diagram showing a process in one embodiment according to the present invention.
Figure 21:
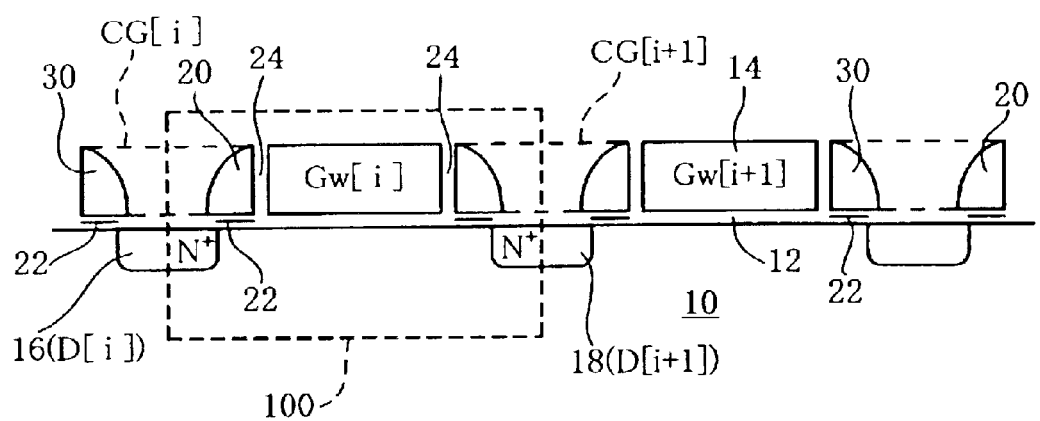
FIG. 21 is a cross sectional view showing a MONOS-type memory cell according to the Background Art.

Next, with reference to FIGS. 5 through 20, a method of manufacturing a nonvolatile memory device according to an embodiment of the present invention will be explained. FIGS. 5 and 6, 8 through 13 and 16 correspond to portions along an A—A line in FIG. 1. FIGS. 14, 17 and 19 correspond to portions along a B—B line in FIG. 1. FIGS. 15, 18 and 20 correspond to portions along a C—C line of FIG. 1. In FIGS. 5 through 20, portions substantially the same as the portions shown in FIGS. 1 through 4 are given the same reference numerals, and explanations thereof will be omitted.

First, on a surface of the semiconductor substrate 10, e.g., an element isolation regions 300 (FIG. 1), e.g., is formed by a trench isolation method. Subsequently, as the channel dope, an ionized, e.g., P type, impurity is implanted, and thereby an impurity layer 17a is formed inside of the semiconductor substrate 10. Thereafter, by ion-implanting an impurity, a contact, e.g., N type, impurity layer 400 (FIG. 1) is formed inside of the semiconductor substrate 10.

Figure 5:
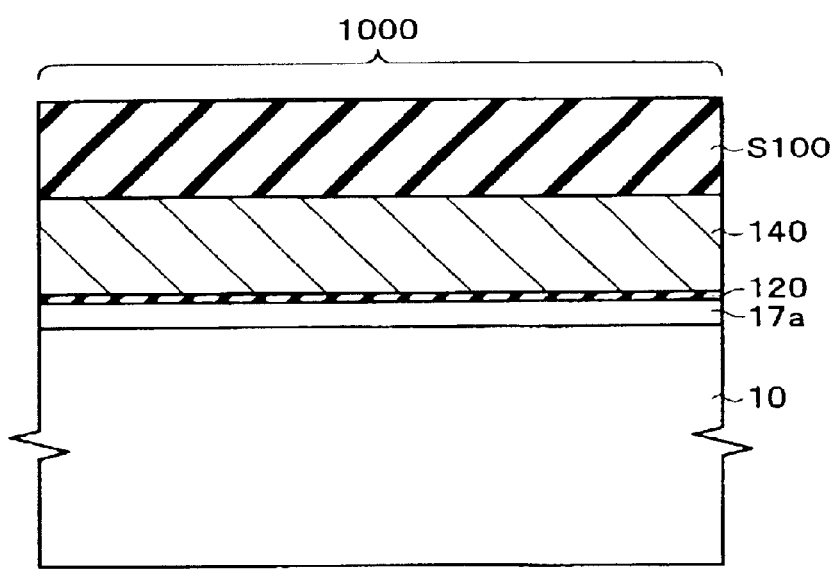
FIG. 5 is a diagram showing a process in one embodiment according to the present invention.

Subsequently, as shown in FIG. 5, on a surface of the semiconductor substrate 10, a first insulating layer 120 to be used as a gate insulating layer is formed. Furthermore, a gate layer (first conductive layer) 140 to be the word gate 14a is deposited on the first insulating layer 120. The gate layer 140 is made of, e.g., doped polysilicon. Subsequently, a stopper layer S100, e.g., for the later CMP process, is formed on the gate layer 140. The stopper layer S100 is made of, e.g., a silicon nitride layer.

Figure 6:
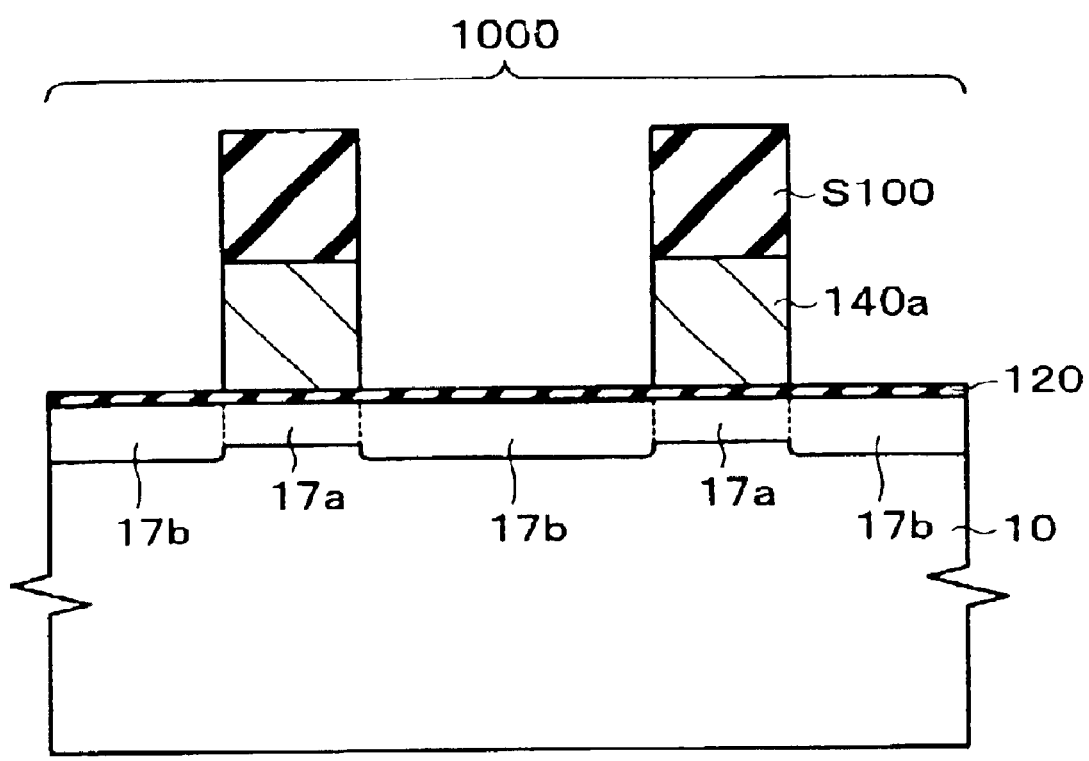
FIG. 6 is a diagram showing a process in one embodiment according to the present invention.

Next, a resist layer (not shown in the drawing) is formed. Subsequently, the stopper layer S100 is patterned by the resist layer as a mask. Thereafter, the gate layer 140 is etched by the patterned stopper layer as a mask. As shown in FIG. 6, the gate layer 140 is patterned into a gate layer (first conductive layer) 140a.

Figure 7:
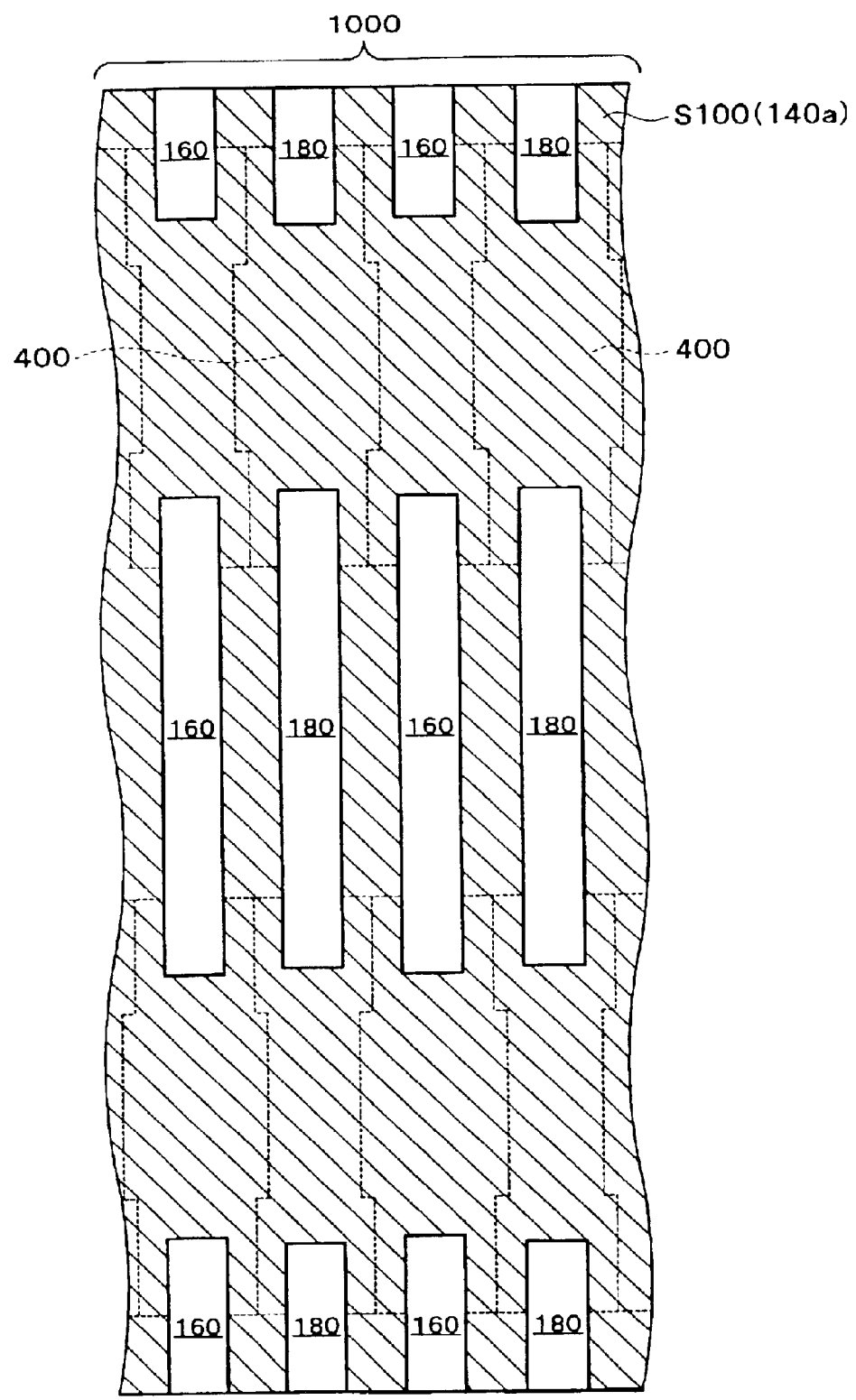
FIG. 7 is a diagram showing a process in one embodiment according to the present invention.

FIG. 7 shows in plan the situation after the patterning. According to the patterning, a laminated body of the gate layer 140 and the stopper layer S100 within the memory region 1000 is provided through openings 160 and 180. The openings 160 and 180 substantially correspond to regions where the impurity regions 16 and 18 are later formed by use of ion implantation. In later processes, the side insulating layers and the control gates are formed along side surfaces of the openings 160 and 180.

Subsequently, as shown in FIG. 6, a punch-through stopper impurity, e.g., P type, is ion-implanted, and thereby inside of the semiconductor substrate 10, an impurity layer 17b is formed.

Figure 8:
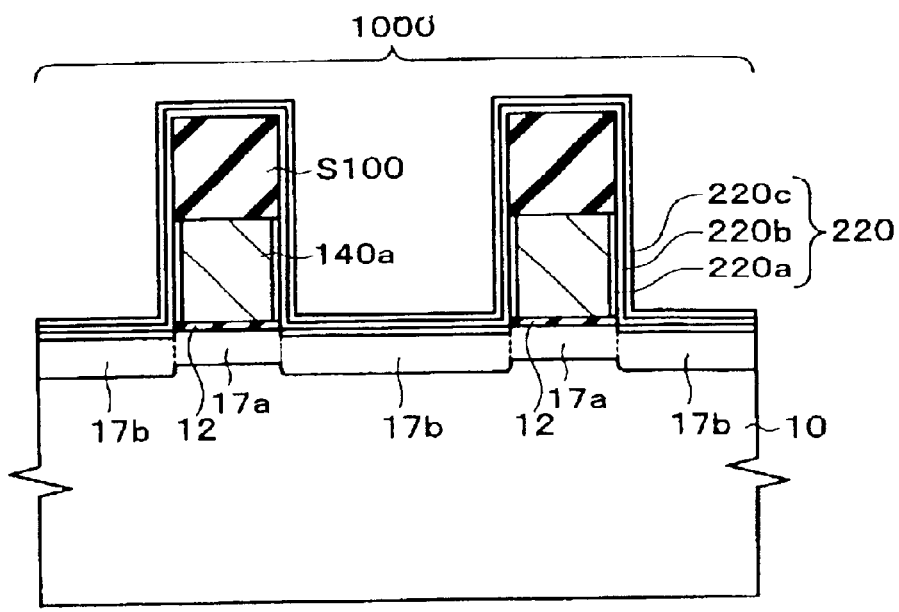
FIG. 8 is a diagram showing a process in one embodiment according to the present invention.

Thereafter, the surface of the semiconductor substrate is cleaned with, e.g., hydrofluoric acid. Thereby, an exposed first insulating layer 120 is removed, and thereby a gate insulating layer 12 is formed. In addition, as shown in FIG. 8, a first silicon oxide layer 220a is formed according to, e.g., a thermal oxidation method. The thermal oxidation film is formed on exposed surfaces of the semiconductor substrate 10 and the gate layer 140a. The first silicon oxide layer 220a may be formed by use of, e.g., a CVD method.

Next, the first silicon oxide layer 220a is annealed. This annealing is applied in an atmosphere including, e.g., a $NH_3$ gas. As a result of this pre-treatment, on the first silicon oxide layer 220a, a silicon nitride layer 220b tends to be uniformly deposited. Thereafter, the silicon nitride layer 220b can be deposited by use of, e.g., a CVD method.

Subsequently, the second silicon oxide layer 220c is formed by use of, e.g., a CVD method, specifically such as a high temperature oxidation method (HTO). The second silicon oxide layer 220c can be deposited also by use of, e.g., ISSG (In-Situ Steam Generation) treatment. A film deposited by use of the ISSG treatment is dense. When the ISSG treatment is applied, an anneal treatment, described later, for densifying the ONO film can be omitted.

In the above process, when the silicon nitride layer 220b and the second silicon oxide layer 220c are deposited in the same furnace, the interface thereof can be prevented from being contaminated due to eliminating a need for intervening removal from the furnace. Since thereby a uniform ONO film can be formed, a memory cell 100 having stable electrical characteristics can be obtained. Furthermore, since a cleaning process for removing the contamination at the interface becomes unnecessary, the number of processes can be reduced.

After these individual layers are formed, it is preferable to apply an anneal treatment with, e.g., wet oxidation or LMP oxidation, and thereby densifying the individual layers.

In this embodiment, the ONO film 220, by a later patterning process, becomes the second insulating layer 22 and the side insulating layer 24 (FIG. 2).

Figure 9:
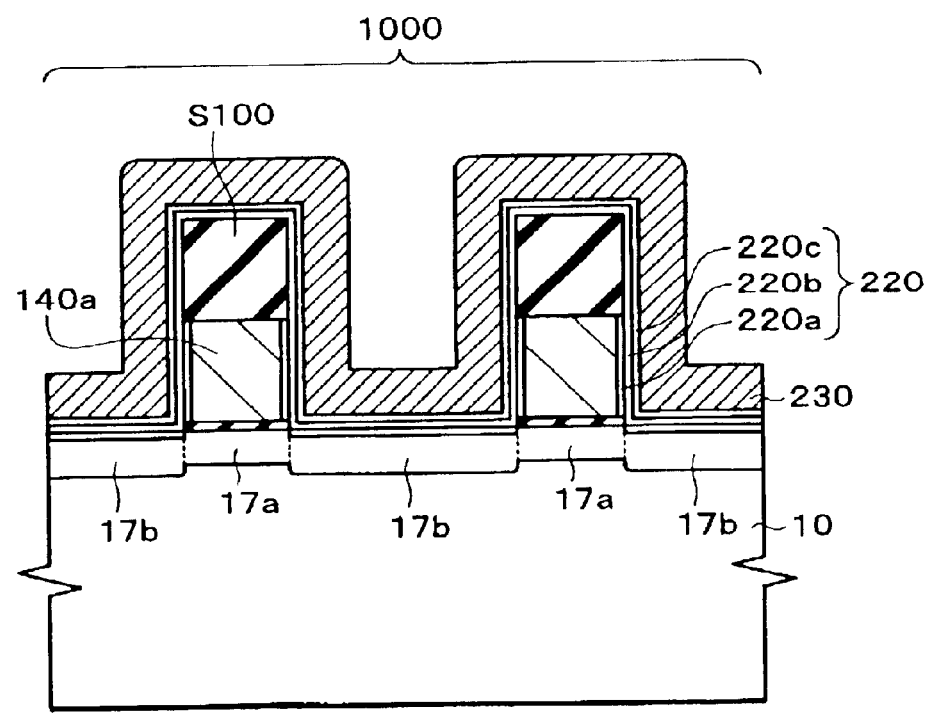
FIG. 9 is a diagram showing a process in one embodiment according to the present invention.

As shown in FIG. 9, a (e.g., second conductive) layer doped polysilicon 230 is formed on the second silicon oxide layer 220c. The doped polysilicon layer 230, etched later, becomes a conductive layer 40 from which are formed the control gates 20 and 30 (FIG. 1).

Figure 10:
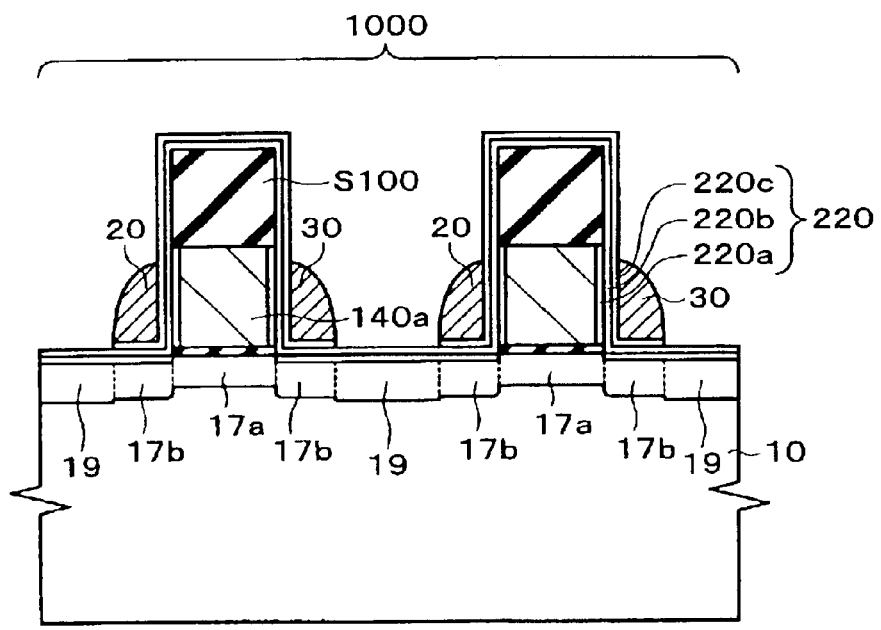
FIG. 10 is a diagram showing a process in one embodiment according to the present invention.

Subsequently, as shown in FIG. 10, the entirety of the doped polysilicon layer 230 is subjected to etching, e.g., anisotropic etching. Thereby, along side surfaces of the openings 160 and 180 (FIG. 7) in the memory region 1000, the first and second control gates 20 and 30 are formed. Here, as shown in FIG. 10, top surfaces of the control gates 20 and 30 to be formed are anisotropically etched until these become lower than the top surface of the gate layer 140a.

Next, as shown in FIG. 10, an (e.g., impurity N type) is ion-implanted, and thereby an impurity layer 19 is formed inside of the semiconductor substrate 10.

Figure 11:
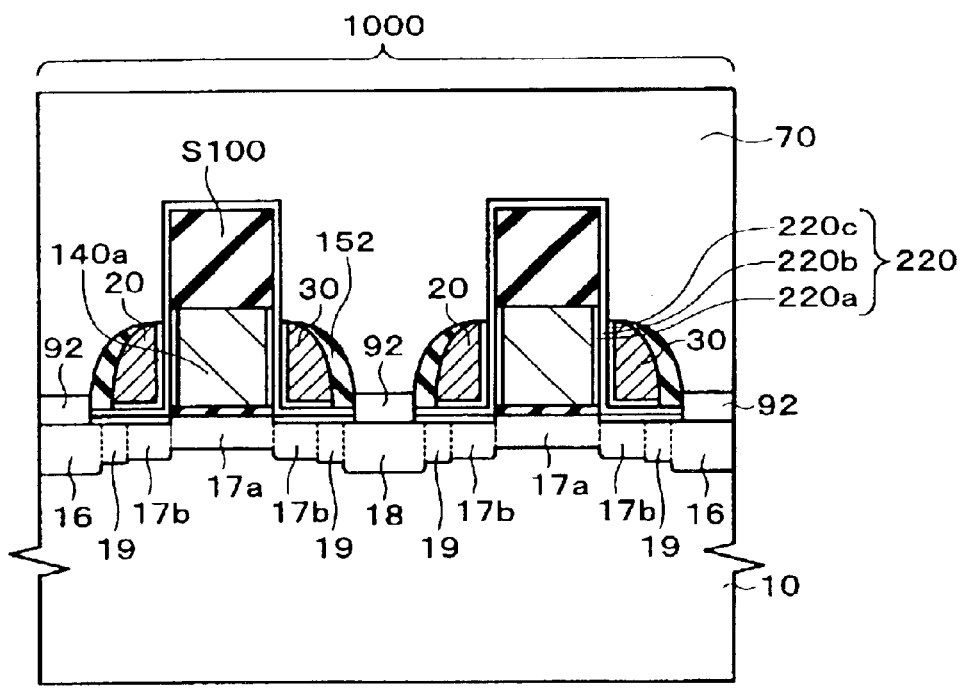
FIG. 11 is a diagram showing a process in one embodiment according to the present invention.

Next, in the memory region 1000, an insulating layer (not shown) of silicon oxide or silicon nitride oxide is formed over the entire surface thereof. Still furthermore, the insulating layer is etched, e.g., anisotropically etched, and thereby, as shown in FIG. 11, insulating layers 152 (having a truncated crescent-shape) are allowed to remain on the control gates 20 and 30. Furthermore, by this etching, an insulating layer deposited in a region where a suicide layer is formed in a later process is removed, and thereby the semiconductor substrate is exposed.

Then, as shown in FIG. 11, an impurity (e.g., impurity N type) is ion-implanted, and thereby inside of the semiconductor substrate 10, the impurity layers 16 and 18 are formed.

Subsequently, a metal for use in silicide formation is deposited over the entire surface. The metal for use in suicide formation is, for instance, titanium or cobalt. Thereafter, the metal formed on the semiconductor substrate is subjected to a silicide reaction, and thereby a silicide layer 92 is formed on the exposed surface of the semiconductor substrate. Next, in the memory region 1000, the second insulating layer 70 of such as silicon oxide or silicon nitride oxide is entirely formed. The second insulating layer 70 is formed so as to cover the stopper layer S100.

Figure 12:
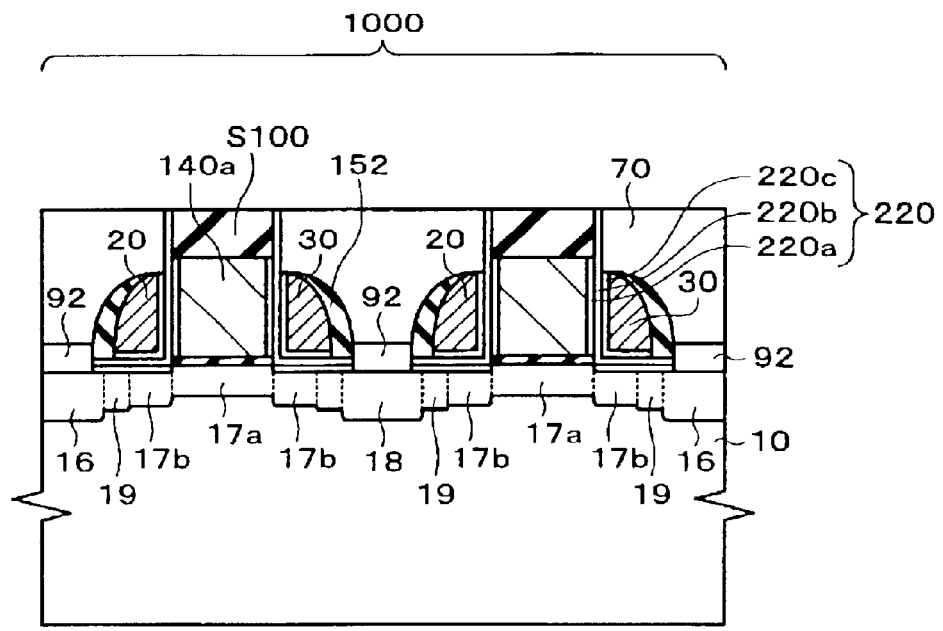
FIG. 12 is a diagram showing a process in one embodiment according to the present invention.

As shown in FIG. 12, the second insulating layer 70 is polished using, e.g., the CMP method until the stopper layer S100 is exposed, thereby planarizing the second insulating layer 70. After the polishing, the second insulating layer 70 remains between the opposing control gates 20 and 30, but it is noted an opening 170a is formed in a second insulating layer 70 (the opening 170a being filled with the remainder of the stopper layer, etc.).

The stopper layer S100 is removed with hot phosphoric acid. As a result, the top surface of at least the gate layer 140a is exposed.

Subsequently, a third conductive layer 50a made of, for instance, doped polysilicon, TiN, or WSi is deposited over the entire surface thereof. Then, on the third conductive layer 50a, an insulating, e.g., silicon oxide layer, 370 is formed over the entire surface by, e.g., CVD. Next, on the silicon oxide layer 370, a patterned resist layer R100 is formed. Using the patterned resist layer R100 as a mask, the silicon oxide layer 370 is patterned. FIGS. 13 through 15, respectively, are diagrams schematically showing portions along an A—A line, a B—B line and a C—C line of FIG. 1 in the memory region 1000 when the resist layer R100 and the silicon oxide layer 370 are patterned. Thereafter, the resist layer R100 is removed.

Subsequently, the third conductive layer 50a and the gate layer 140a are successively etched, e.g., anisotropically etched, using the silicon oxide layer 370 as a mask. Thereby, as shown in FIGS. 16 through 18, the word line 50 is formed as the remainder of the third conductive layer 50a and the word gate 14a is formed as the remainder of the gate layer 140a. FIGS. 16 through 18, respectively, are diagrams schematically showing portions along an A—A line, a B—B line and a C—C line of FIG. 1 in the memory region 1000 when the anisotropic etching process is completed.

In the etching process, the conductive layer 40 that includes the first and second control gates 20 and 30, being covered by the second insulating layer 70, is left without being etched.

However, in some cases, the gate layer 140a is not completely removed and a remnant 14c of the gate layer 140a remains on the side surface of the word gate 14a (FIG. 18) and the side surface of the side insulating layer 24 (FIG. 17).

The remnant 14c can be removed by etching, e.g., isotropic etching. When the remnant 14c is removed by isotropic etching, for instance, a CDE (Chemical Dry Etching) method can be used with an etching gas, for instance, that includes $CF_4$ and $O_2$. Furthermore, in this isotropic etching, the selective ratio of the remnant 14c to the second insulating layer 70 is not necessary but preferably in the range of about 5 to 100, or more preferably in the range of about 10 to 100.

Furthermore, in the isotropic etching process, as shown in FIGS. 19 (successor to FIG. 17) and 20 (successor to FIG. 18), a groove 170 is formed in the semiconductor substrate 10 by over-etching.

The groove 170 is formed in a region between the word gates 14a in a Y direction.

Subsequently, an (e.g., impurity P type) is doped over the entire semiconductor substrate 10. Thereby, in regions between individual word gates 14a in a Y direction, P type impurity layers (impurity layer for use in element isolation) 15 (FIGS. 1, 3 and 4) are formed. Owing to the P type impurity layers 15, the element isolation between individual nonvolatile semiconductor memory devices 100 can be more secured. Furthermore, the P type impurity layer 15 is formed inside of the groove 170 (FIGS. 19 and 20).

Subsequently, the interlayer insulating layers 72 are formed. By this process, as shown in FIGS. 3 and 4, the interlayer insulating layer 72 is buried in the groove 170 disposed on the semiconductor substrate 10.

According to the above processes, the semiconductor device shown in FIGS. 1 through 4 can be manufactured.

Some advantages of such manufacturing methods include the following.

Firstly, after the word line 50 and the word gate 14a are formed the remnant 14c left on the side surfaces of the word gate 14a and the side insulating layer 24 can be removed. Thereby, it can be avoided that the word gates 14a, which are located adjacently each other, are short-circuited via the remnant 14c.

Secondly, when a photo resist is used as a mask at the time of forming the word line 50 and word gate 14a, a material produced by reaction of a carbon component in the resist material and the gate layer 140a becomes a protective film so that the remnants 14c tend to occur. Where etching is carried out using the silicon oxide layer 370 as a mask, use of the resist can be eliminated, obviating formations of the undesired protective film. Thereby, it can be prevented that the adjacent word gates 14a which are located adjacently each other is short-circuited (due otherwise to the remnants 14c).

While the present invention has been particularly shown and described with reference to embodiments thereof, other changes in form and details may be made therein without departing from the spirit and scope of the invention. For instance, a SOI substrate may be replaced as a semiconductor substrate instead of a bulk semiconductor substrate used in the above embodiment.

The entire disclosure of Japanese Patent Application No. 2002-059145 filed Mar. 5, 2002 is incorporated by reference herein.

What is claimed is:

1. A method for manufacturing a nonvolatile memory device, the method comprising:

forming, as a first intermediate structure, a gate layer on which a stopper layer is disposed above a semiconductor layer;

forming an ONO film on the first intermediate structure;

forming a side wall control gate on the ONO film and aside each of both side surfaces of the gate layer resulting in a second intermediate structure;

forming an insulating layer on the second intermediate structure;

polishing the insulating layer so as to expose the stopper layer;

removing the stopper layer, and thereby exposing the top surface of the gate layer;

forming a conductive layer above the gate layer and the insulating layer;

forming a word line and a word gate by removing portions of the conductive layer and first portions of the gate layer, the word line extending in a first direction;

after forming the word line and the word gate, further removing second portions of the gate layer, the further removing of the second portions of the gate layer exposing portions of the semiconductor substrate and then removing material from the exposed portions resulting in a groove being formed in the semiconductor substrate, the groove being adjacent to the word gate and extending in a second direction, the second direction intersecting with the first direction; and filling a second insulating layer within the groove.

2. A method for manufacturing a nonvolatile memory device as set forth in claim 1, wherein the further removing of the second portions of the gate layer further comprises applying isotropic etching to the gate layer.

3. A method for manufacturing a nonvolatile memory device as set forth in claim 2, wherein in the isotropic etching of the gate layer, the selective ratio of the gate layer to the insulating layer is in the range of about 5 to 100.

4. A method for manufacturing a nonvolatile memory device as set forth in claim 3, wherein the forming of the word line and the word gate includes using a patterned silicon oxide layer as a mask.

5. A method for manufacturing a nonvolatile memory device as set forth in claim 3, wherein the range is about 10 to 100.

6. A method for manufacturing a nonvolatile memory device as set forth in claim 2, wherein the forming of the word line and the word gate includes using a patterned silicon oxide layer as a mask.

7. A method for manufacturing a nonvolatile memory device as set forth in claim 1, wherein the forming of the word line and the word gate includes using a patterned silicon oxide layer as a mask.

8. A method for manufacturing a nonvolatile memory device, the method comprising:

forming a gate layer on a semiconductor layer with a first gate insulating layer therebetween, the gate layer having a stopper layer disposed above the gate layer;

forming a control gate on the semiconductor layer with a second gate insulating layer therebetween, the control gate also being formed on the gate layer with a side insulating layer therebetween;

forming a first insulating layer above the gate layer and the control gate;

polishing the first insulating layer so as to expose the stopper layer;

removing the stopper layer to expose the top surface of the gate layer;

forming a conductive layer above the gate layer and the first insulating layer;

etching the conductive layer and the gate layer to form a word line and a word gate, the word line extending in a first direction;

removing remnants of the gate layer after etching the gate layer to form a groove in the semiconductor layer, the groove being adjacent to the word gate and formed in a second direction, the second direction intersecting with the first direction; and filling a second insulating layer within the groove.

9. The method as set forth in claim 8, wherein the removing of the remnant portions of the gate layer further comprises applying isotropic etching to the gate layer.

10. The method as set forth in claim 9, wherein after forming the groove, a P-type impurity layer is doped over the semiconductor substrate.

11. The method as set forth in claim 10, wherein the P-type impurity layer is formed inside of the groove.

12. The method as set forth in claim 8, wherein the forming of the word line and the word gate includes using a patterned silicon oxide layer as a mask.

13. A nonvolatile memory device having a plurality of memory cells arranged in a matrix, each memory cell comprising:

a word gate formed on a semiconductor layer with a first gate insulating layer therebetween;

a control gate formed on the semiconductor layer with a second gate insulating layer therebetween, the control gate also being formed on the word gate with a side insulating layer therebetween;

a first insulating layer formed above the control gate;

a word line electrically connected to the word gate, the word line extending in a first direction; and a groove adjacent to the word gate, the groove being formed in a second direction that intersects the first direction and filled with a second insulating layer.

* * * * *

UNITED STATES PATENT AND TRADEMARK OFFICE
CERTIFICATE OF CORRECTION

PATENT NO. : 6,943,082 B2
DATED : September 13, 2005
INVENTOR(S) : Takumi Shibata It is certified that error appears in the above-identified patent and that said Letters Patent is hereby corrected as shown below:

<u>Column 4,</u>
Line 8, "suicide" should be -- silicide --.

<u>Column 6,</u>
Lines 54 and 63, "suicide" should be -- silicide --.

Signed and Sealed this

Sixteenth Day of May, 2006

JON W. DUDAS
*Director of the United States Patent and Trademark Office*